United States Patent [19]

Itsumi et al.

[11] Patent Number: 4,566,940
[45] Date of Patent: Jan. 28, 1986

[54] MANUFACTURING PROCESS FOR SEMICONDUCTOR INTEGRATED CIRCUITS

[75] Inventors: Manabu Itsumi, Hoya; Kohei Ehara, Kodaira; Susumu Muramoto; Seitaro Matsuo, both of Hachioji, all of Japan

[73] Assignee: Nippon Telegraph and Telephone Public Corporation, Japan

[21] Appl. No.: 661,700

[22] Filed: Oct. 17, 1984

Related U.S. Application Data

[62] Division of Ser. No. 369,234, Apr. 16, 1982, abandoned.

[30] Foreign Application Priority Data

Apr. 21, 1981 [JP] Japan .................................. 56-61070

[51] Int. Cl.$^4$ ...................... H01L 21/306; B44C 1/22; C03C 15/00; C23F 1/02
[52] U.S. Cl. ..................................... 156/643; 29/571; 29/576 W; 29/580; 148/187; 156/646; 156/648; 156/653; 156/656; 156/657; 156/661.1; 156/662; 357/42; 357/71; 427/38; 427/90; 427/93

[58] Field of Search ............... 29/571, 576 W, 580; 148/1.5, 187; 427/38, 39, 89, 90, 93, 85, 86; 156/643, 646, 648, 649, 653, 657, 659.1, 661.1, 662, 656; 357/42, 49, 59, 71; 430/313, 314, 317, 318

[56] References Cited

U.S. PATENT DOCUMENTS

| 4,300,279 | 11/1981 | Wieder .................................. 29/571 |
| 4,367,119 | 1/1983 | Logan et al. ..................... 156/655 X |
| 4,381,595 | 5/1983 | Denda et al. ..................... 29/571 X |
| 4,389,481 | 6/1983 | Poleshuk et al. ................. 29/571 X |

*Primary Examiner*—William A. Powell
*Attorney, Agent, or Firm*—McGlew and Tuttle

[57] ABSTRACT

A semiconductor integrated circuit in which layers such as an field isolation region, a gate electrode, interlayer insulating films and interconnection lines are formed by the combined use of a lift-off process and an ECR plasma deposition process. According to the present invention, even if vertical dimensions of patterns of the respective layers are large as compared with their lateral dimensions, the upper surfaces of the respective layers can be planarized, permitting the fabrication of an LSI of high packing density, high operating speed and high reliability which is free from shorting and breakage of the interconnection lines.

3 Claims, 29 Drawing Figures

MANUFACTURING PROCESS FOR SEMICONDUCTOR INTEGRATED CIRCUITS

This is a division of application Ser. No. 369,234 filed Apr. 16, 1982, abandoned.

BACKGROUND OF THE INVENTION

1. Field of the Invention

The present invention relates to semiconductor integrated circuits which are of high reliability and high packing density and permits a multilayer construction. The invention also pertains to a manufacturing process of such semiconductor integrated circuits.

2. Description of the Prior Art

In recent years, semiconductor integrated circuit technology has achieved a remarkable development for high packing density and high operating speed. Especially, marked innovations have been made in the fabrication technology; for instance, new lithographic techniques such as electronbeam lithography, projection photolithography and X-ray lithography have been introduced, and etching techniques suitable for microfabrication of semiconductor integrated circuits, such as parallel plate plasma etching, have also been introduced. The abovesaid new lithographic techniques permit the formation of a submicron resist pattern, and the dry etching technology enables anisotropic etching and possesses the advantage that it is able to perform satisfactory etching of a submicron pattern without incurring undercutting. Now that such miniature patterning technology and anisotropic etching technology have been introduced into the fabrication process of semiconductor integrated circuits, a conductor layer of a submicron width can be produced with high accuracy.

In conventional semiconductor integrated circuits, their lateral dimensions have thus been reduced markedly but vertical dimensions, such as the film thickness, could not have much been decreased for the following reasons:

(1) Since wiring resistance and parasitic capacitance must be minimized so as to achieve the high operating speed of the device, the thicknesses of a conductor layer and an insulating layer cannot be made so small.

(2) The ion implantation process is indispensabel as an impurity introduction technique suitable for miniaturized devices, but if the conductor layer or insulating layer for use as a mask for ion implantation is formed too thin, then its masking effect is lost; this imposes limitations on thinning of these layers.

(3) A decrease in the thickness of the conductor layer or insulating layer often causes an increase in the number of pinholes and deterioration of the film quality, resulting in lowered yield rate of device fabrication and lowered reliability of product devices.

Since the vertical dimensions cannot be reduced so much as the lateral ones for the abovesaid reasons, what is called a step height tends to increase relatively, thus presenting such problems as follows:

First, when the conductor layer or insulating layer is subjected to patterning through dry etching technology featuring anisotropic etching, the side wall of the layer becomes vertical. This debases the coverage of a film formed on the layer to cause shorting between interconnection lines or breakage of them, resulting in appreciably lowered yield of device fabrication. To avoid this, it is necessary to increase the thickness of the film which is formed on the conductor or insulating layer. By the way, in the case of employing the dry etching technology, the ratio in etching rate between a resist material and a material to be etched cannot be set large. Therefore, the resist layer is reduced in thickness during etching. Accordingly, When the film thickness of the material to be etched is large, the resist layer has to be formed to a thickness large enough to serve as an etching mask. However, since an increase in the thickness of the resist layer lowers resolution of a resist pattern which is formed through using lighography, minimum dimensions of the pattern that can be obtained become larger as the number of layers increases. In the case of wet etching technology, the layer to be etched is subject to side etching, so that if the layer is thick, the minimum pattern dimension as well as the film thickness inevitably increase as the uppermost layer is approached. This means that even if a multilayer structure is employed to increase the number of layers, the structure cannot be made so high-density, resulting in no particular effect being produced by the multilayer construction. In addition, differences in surface level in respective layers of the multilayer structure are accumulated, and this also imposes limitations on the number of layers constituting the multilayer structure.

Second, photolithography is much affected by unevenness of the specimen surface. The thickness of the resist layer formed on the specimen surface is large on a depression in the specimen surface and small on a projection. Accordingly, when the resist layer patterned under the same exposure condition over the entire area of the surface of the resist layer, the pattern dimension on the projection in the specimen surface becomes smaller than the pattern dimension on the depression.

To solve such problems, there have heretofore been developed various techniques intended for planarizing the surface of each layer of semiconductor integrated circuits. For instance, a selective oxidation technique has been employed for forming a field oxide film that is used for field isolation. This method achieves planarization to some extent (see J. A. Apples et al., "Local Oxidation of Silicon", Philips Res. Repts 25, 118–132, 1970). However, a close examination of the layer surface planarized by this method reveals that the surface is not always flat and contains a lateral extension of the oxide projection called a bird's beak and dump called a bird's head. And this local oxidation of silicon necessitates the use of thermal oxidation that involves high-temperature, long-time heat treatment.

Another planarization technique heretofore developed is a glass flow technique, which is also widely employed (see A. C. Adams et al., "Planarization of Phosphorus-Doped Silicon Dioxide", J. Electrochem. Soc., Vol. 128, No. 2, P 423, 1981). This is a method that forms PSG $SiO_2$ on a stepped portion and heat treating it by a high temperature annealing process at 900° to 1000° C., thereby changing the stepped portion into a gentle shape. With this method, however, the absolute step height between adjacent layers remains substantially unchanged. By tapering of the stepped portion the coverage of an overlying film is improved but the absolute step height remains unchanged; therefore, the defect of the lithographic technique that is susceptible to the influence of unevenness in the specimen surface is still left unsolved.

For a multilevel metallization structure there have heretofore been reported such planarization techniques as an aluminum anodic process, a lift-off process and resin coating process (see G. C. SchWartz and V. Platter, "An Anodic Process for Forming Planar Interconnection Metallization for Mutilevel LSI", J. Electrochem. Soc., Vol. 122, No. 11, p 1508, November 1975). According to the aluminum anodic process, aluminum is deposited all over the surface of the underlying layer to be deposited upon and then selectively changed by an anodization method into $Al_2O_3$ at those areas unnecessary for wiring, thereby to planarize the surface of the aluminum layer. This process enables the multilayer construction and prevents electromigration, but has the defect that high packing density is limited because the wiring pattern has to be designed taking anodic oxidation into account.

The lift-off process is divided into a method of forming conductor wiring layers and then burying an insulating layer between the wiring layers, and a method of forming insulating layers locally and then burying a conductor wiring layer between the insulating layers (see B. M. Welch et al., "LSI Processing Technology for Planar GaAs Integrated Circuits", IEEE Trans. Electron Devices, Vol. ED-27, No. 6, PP 1116–1124, June 1980). To facilitate the lift-off process, it is necessary that the film be formed at low temperatures at which photoresist is not subject to appreciable deformation and deterioration. In general, however, the film formed at low temperatures is poor in quality and is not fit for practical use. The films which can be formed at low temperatures and are fit for practical use a only aluminum and molybdenum. Furthermore, in the conventional semiconductor integrated circuit structure, the underlying layer is uneven, and the thickness of the resist layer and the shape of its side wall differ according to location; therefore, it is difficult to carry out the lift-off over the entire area of the resist layer with good yield. Hence, the lift-off process is not employed in general. The planarization by the resin coating process is effected, for instance, by polyimide resin coating, but this planarization is not satisfactory, either.

SUMMARY OF THE INVENTION

It is therefore an object of the present invention to provide a semiconductor integrated circuit which is free from a difference in surface level between adjoining insulating and conductor layers, and hence is suitable for high packing density and multilayer construction and highly reliable.

Another object of the present invention is to provide a method for the manufacture of such semiconductor integrated circuit.

DESCRIPTION OF THE PREFERRED EMBODIMENTS

Figure 1:
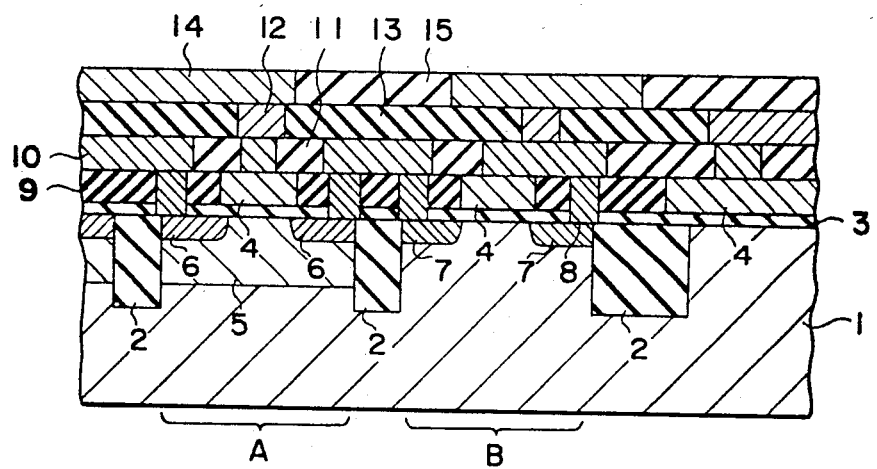
FIG. 1 is a cross-sectional view illustrating an embodiment of the present invention.

FIG. 1 illustrates, in cross-section, an embodiment of the present invention. Reference numeral 1 indicates a p type silicon substrate; 2 designates a thick silicon dioxide film recessed into the p type silicon substrate 1; 3 identifies a gate oxide film; 4 denotes a silicon layer as of polycrystalline silicon which constitutes a gate electrode; 5 represents an n type diffused layer; 6 shows a p+ type diffused layer; 7 refers to an n+ type diffused layer; 8 signifies a silicon layer as of polycrystalline silicon; 9, 11, 13, and 15 indicate silicon oxide films; and 10, 12 and 14 designate aluminum layers which serve as interconnection lines.

The embodiment is directed to a CMOS integrated circuit. In FIG. 1, the portion identified by A constitutes a p-channel MOS FET and the portion identified by B an n-channel MOS FET. The silicon dioxide film 2 is completely recessed into the substrate 1, and the upper surfaces of the silicon dioxide film 2 and the substrate 1 are substantially flush with each other. The upper surfaces of the polycrystalline silicon layer 4, which forms the gate electrode, the silicon oxide film 9 and the polycrystalline silicon layer 8 are parallel to the upper surface of the p type silicon substrate 1 and are thus planarized. Further, the aluminum layer 10 and the silicon oxide layer 11, the aluminum layer 12 and the silicon oxide film 13, and the aluminum layer 14 and the silicon oxide layer 15 are also planarized in their upper surfaces. What is meant by the word "planarized" herein mentioned is that differences in surface level between such conductor layers as the polycrystalline silicon layers 4 and 8 and the aluminum layers 10, 12 and 14 and such insulating layers as the silicon oxide layers 9, 11, 13 and 15 are each less than 30% of the thickness of each conductor layer. Strictly speaking, the planarization indicates such a state that a maximum value of the difference in surface level within a circle of a 5 µm radius about a given point is less than 30% of the thickness of the conductor layer.

Such planarization of the upper surfaces of each conductor layer and each insulating layer markedly eliminates the possibility of breakage and short-circuiting of the interconnection lines, improving the reliability of the integrated circuit.

The structure shown in FIG. 1 possesses the following features in terms of manufacutre. Since the surfaces of the underlying layers upon which the conductor layers for the gate electrode and the aluminum interconnection lines are to be deposited are planarized, the conductor layers are formed uniformly, introducing no problem in respect of coverage. Further, photoresist which is formed on the conductor layers also becomes uniform in thickness and can be easily patterned by photolithography, and hence it can be miniaturied. In this way, the surfaces of the layers which are deposited one on another are always planarized, so that serious obstacles to the multilayer construction are all solved, facilitating the formation of a multilayer structure. This also permits the application of the same pattern rule to all of the layers to be formed, which has been impossible with conventional LSI fabrication technology. The same pattern rule herein mentioned means that minimum patters dimensions of the layers are the same. Since the present invention enables miniaturization of a pattern for each layer and the formation of the multilayer structure, the integrated circuit devices of the construction according to the present invention exhibit the advantages of high packing density and high operating speed over the conventional integrated circuit devices.

Although FIG. 1 shows an embodiment of the present invention as being applied to the CMOS integrated circuit, it is a matter of course that the invention is equally applicable to an integrated circuit having a structure of either one of the p-channel MOS FET and the n-channel MOST FET.

Figure 2:
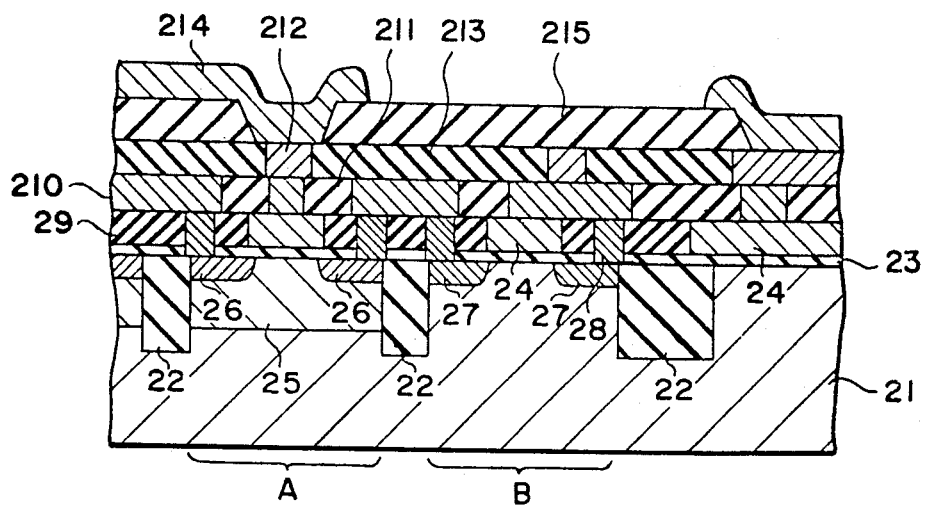
FIG. 2 is a cross-sectional view illustrating another embodiment of the present invention which differs from the FIG. 1 embodiment in that the surface of the uppermost aluminum layer of a semiconductor ingetrated circuit is not planarized.

FIG. 2 illustrates in cross section another embodiment of the present invention, which differs from the embodiment of FIG. 1 in that the surface of an aluminum layer 214 lying on the top of the semiconductor integrated circuit is not planarized. In FIG. 2, reference numeral 21 indicates a p type silicon substrate; 22 designates a thick silicon dioxide film recessed into the p type silicon substrate 21; 23 identifies a gate oxide film; 24 denotes a polycrystalline silicon layer which forms a gate electrode; 25 represents an n type diffused layer; 26 shows a p+ type diffused layer; 27 refers to an n+ type diffused layer; 28 signifies a polycrystalline silicon layer; 29, 211, 213, and 215 indicate silicon oxide films; and 210, 212 and 214 designate aluminum layers which serve as interconnection lines.

The uppermost aluminum layer 214 is usually a bonding pad, and is not always required of microfabrication and can be formed sufficiently thick, for instance, 1 to 3 μm, and hence it is relatively immune from unevenness in the surface of the underlying layer. Accordingly, the uppermost aluminum layer 214 does not much affect the device performances such as high packing density and high reliability, and it need not always be planarized. It is preferred, of course, that this layer be also planarized.

Figure 3:
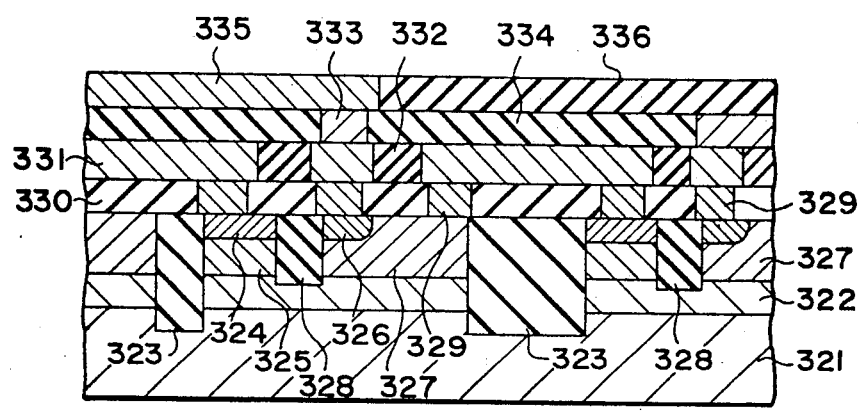
FIG. 3 is a cross-sectional view illustrating another embodiment of the present invention.

FIG. 3 illustrates, in cross-section, another embodiment of the present invention. In FIG. 3, reference numeral 321 indicates a p type silicon substrate; 322 designates an n+ type buried diffused layer; 323 identifies a silicon oxide layer for field isolation; 324 denotes an n+ type diffused layer which forms a collector; 325 represents an n type diffused layer; 326 shows an n+ type diffused layer which forms an emitter; 327 signifies a p type diffused layer which serves as a base; 329 indicates a buried silicon oxide film; 328 designates a polycrystalline silicon layer which acts as an electrode for contact with each diffused layer; 330, 332, 334 and 336 identify silicon oxide films; and 331, 333 and 335 denote aluminum layers which function as interconnection lines.

This embodiment is directed to a bipolar transistor which uses the n+ type diffused layer 324 as the collector, the n+ type diffused layer 326 as the emitter and the p type diffused layer 327 as the base. Also in this case, the upper surfaces of the silicon oxide films 323 and 328, the n+ type diffused layer 324 and the p type diffused. layer 327 are level with one another, and the upper surfaces of the polycrystalline silicon layer 329 and the silicon oxide film 330, the upper surfaces of the aluminum layer 331 and the silicon oxide film 332, the upper surfaces of the aluminum layer 333 and the silicon oxide film 334, and the upper surfaces of the aluminum layer 335 and the silicon oxide film 336 are parallel to the p type silicon substrate 321; hence they are planarized. Such planarization of the upper surface of each layer enables miniaturization of a pattern for each layer and the formation of a multilayer arrangement, and introduces substantially no step height between adjacent layers, thus achieving high packing density, high operating speed and high reliability.

Figure 4A:
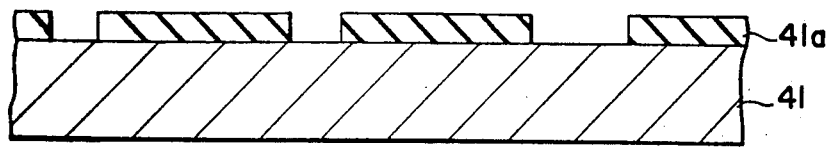
FIGS. 4(A) to (Z) are cross-sectional views illustrating, by way of example, a sequence of steps involved in the manufacure of the semiconductor integrated circuit depicted in FIG. 1.
Figure 4B:
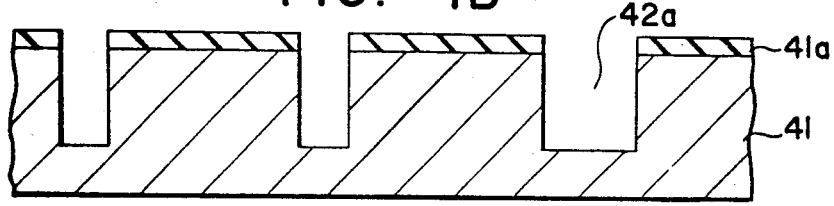
Figure 4C:
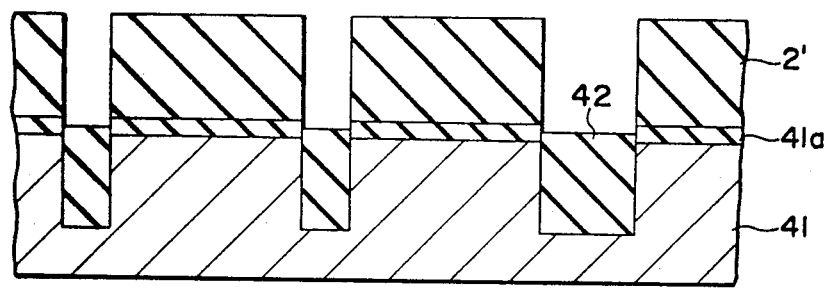
Figure 4D:
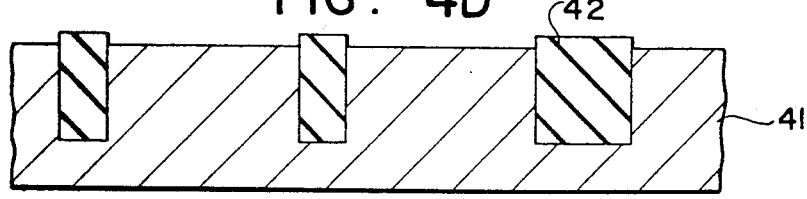
Figure 4E:
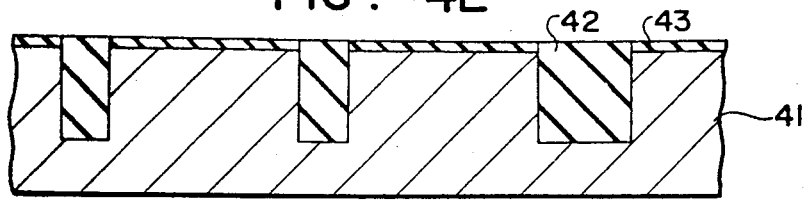
Figure 4F:
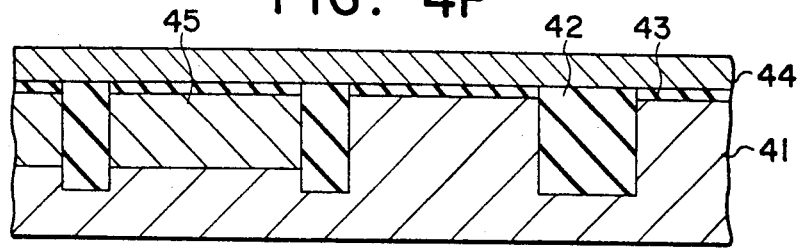
Figure 4G:
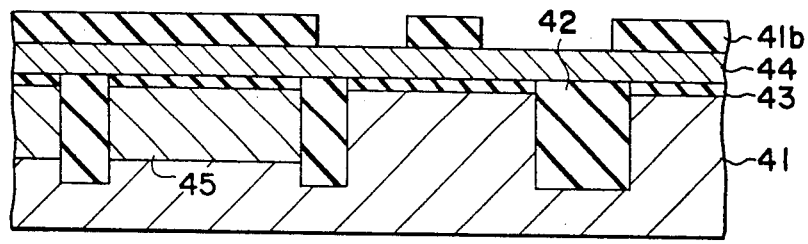
Figure 4H:
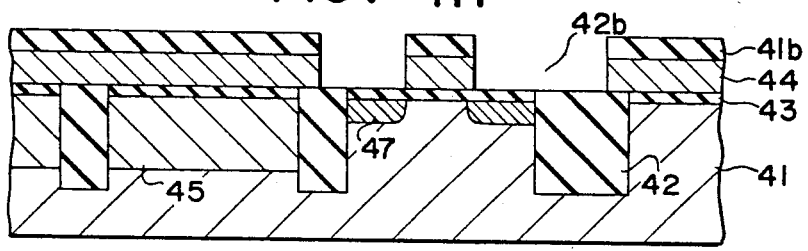
Figure 4I:
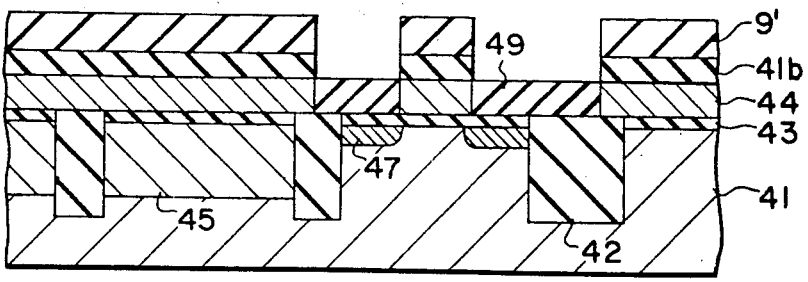
Figure 4J:
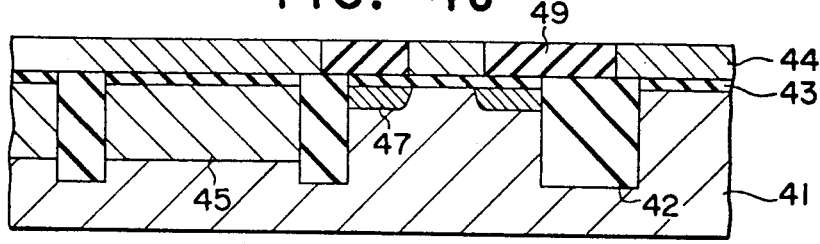
Figure 4K:
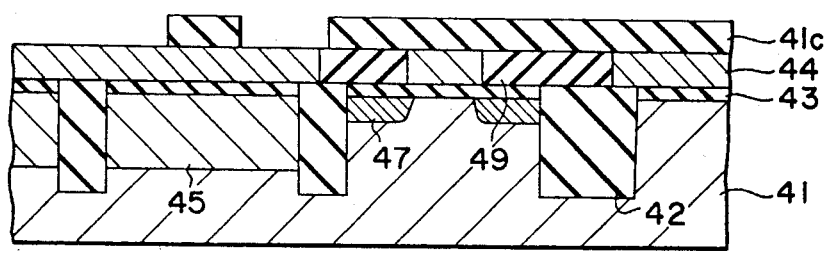
Figure 4L:
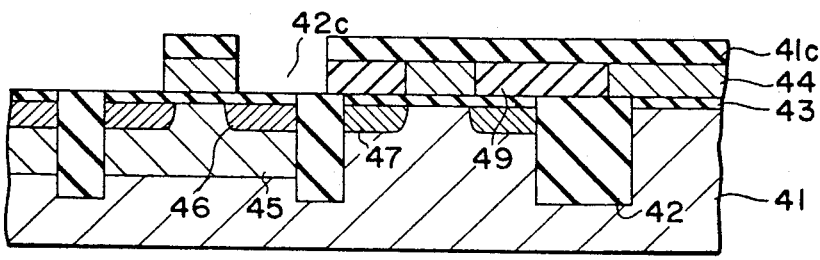
Figure 4M:
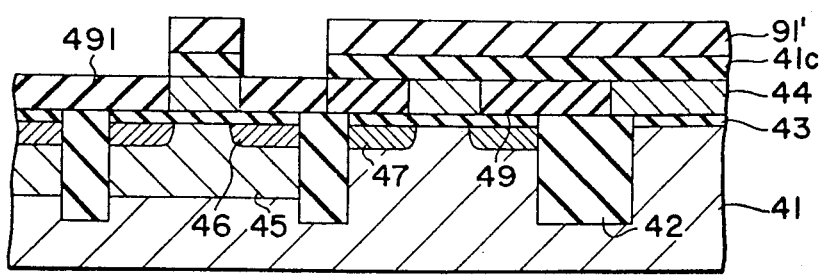
Figure 4N:
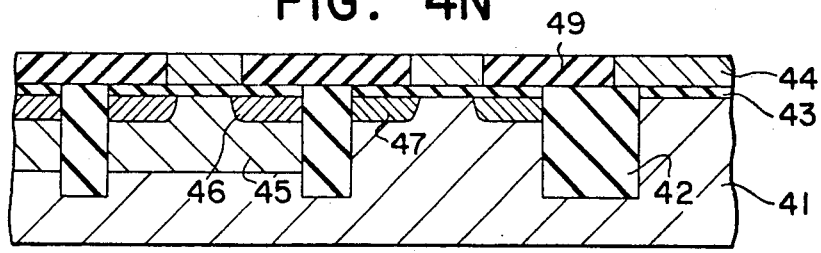
Figure 4O:
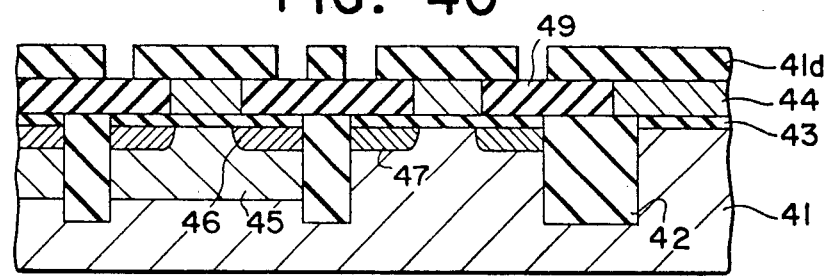
Figure 4P:
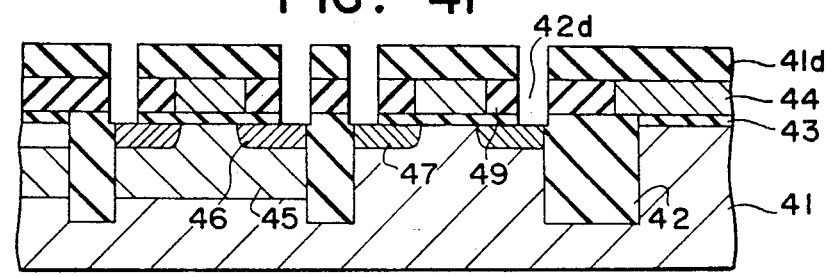
Figure 4Q:
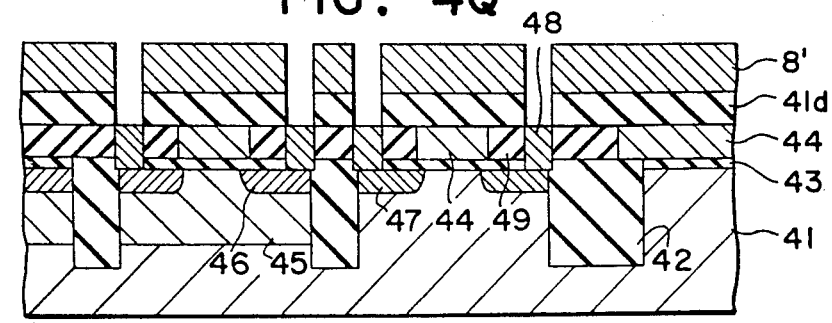
Figure 4R:
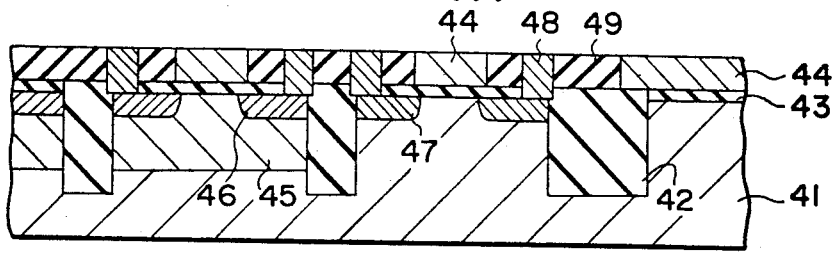
Figure 4S:
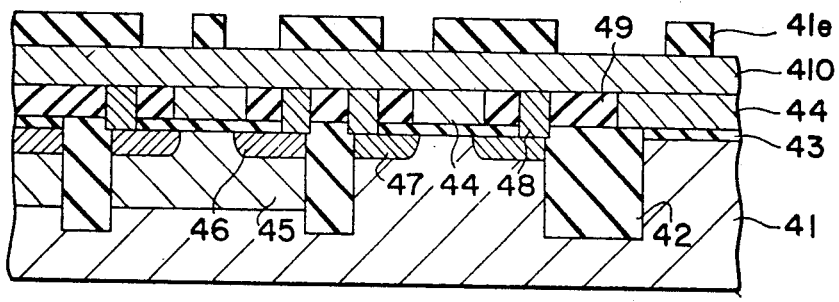
Figure 4T:
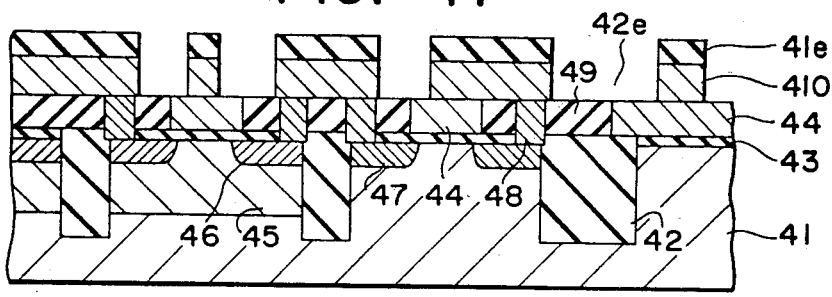
Figure 4U:
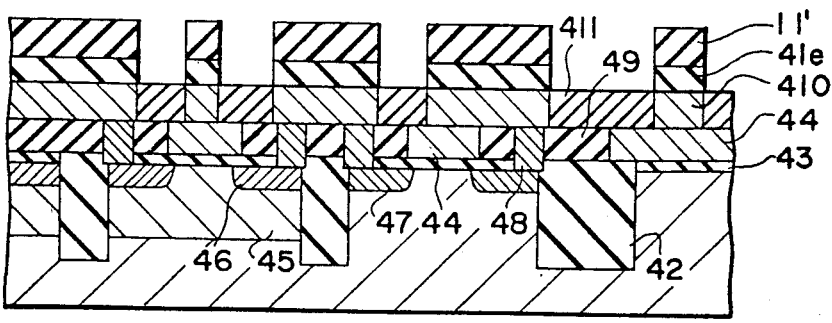
Figure 4V:
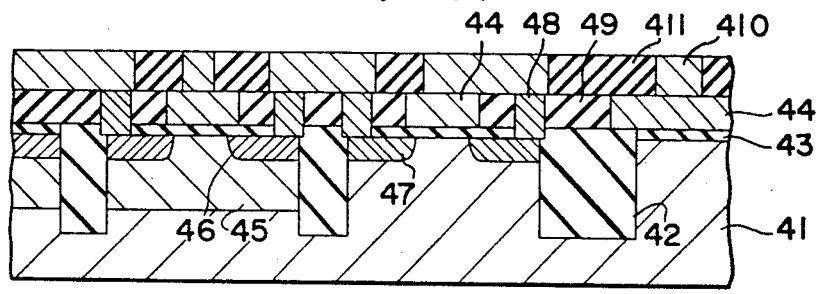
Figure 4W:
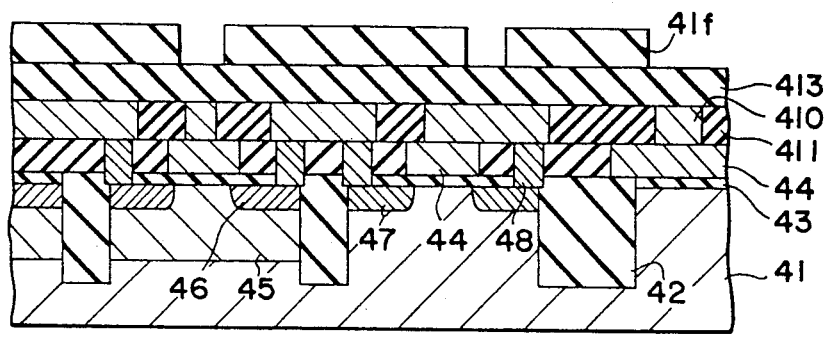
Figure 4X:
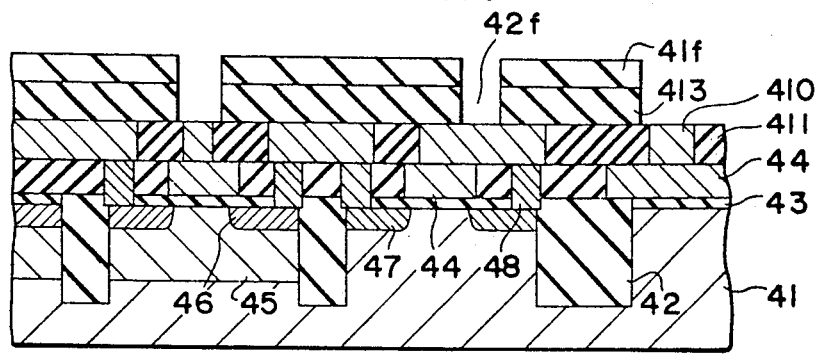
Figure 4Y:
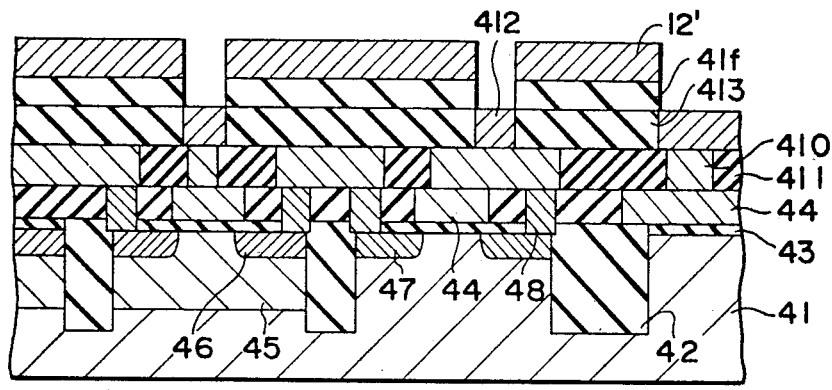
Figure 4Z:
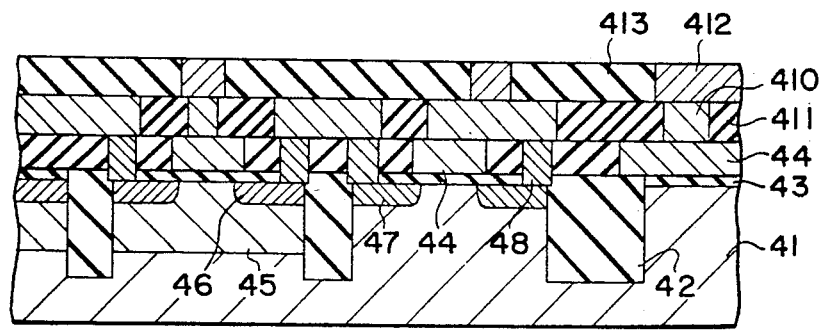

FIGS. 4(A) to (Z) illustrate, by way of example, a method for the manufacture of the semiconductor integrated circuit according to the present invention. In FIGS. 4(A) to (Z), reference numerals 41a to 41f indicate photoresist layers; 42a to 42f designate etched grooves rectangular in cross section 2', 9', 91' and 11' identify silicon films; 8' denotes a polycrystalline silicon layer; 12' represents an aluminum layer; 41 shows a p type silicon substrate; 42 refers to a thick silicon film recessed into the p type silicon substrate 41; 43 signifies a gate oxide film; 44 indicates a polycrystalline silicon layer which will ultimately form a gate electrode; 45 designates an n type diffused layer; 46 identifies a p+ type diffused layer; 47 denotes an n+ type diffused layer; 48 represents a polycrystalline silicon layer; 49, 411 and 413 show silicon oxide films; and 410 and 412 refer to aluminum layers which will ultimately serve as interconnection lines.

The manufacture starts with local formation of the photoresist layer 41a on the p type silicon substrate 41 having a resistivity of, for instance, several Ω·cm as shown in FIG. 4(A).

The p type silicon substrate 41 is selectively etched away through using the photoresist layer 41a as a mask, thereby to form the groove 42a 4 μm deep as depicted in FIG. 4(B). This etching can be effected by parallel plate plasma etching process having etching anisotropy.

Next, the silicon oxide film 42 is deposited through the use of an ECR (Electron Cyclotron Resonance) plasma deposition process to fill up groove 42a, forming a field isolation region as shown in FIG. 4(C). During the deposition of the silicon oxide film 42, the silicon oxide film 2' is also deposited on the photoresist layer 41a at the same time.

The ECR plasma deposition process is a method that deposits a desired film on a substrate by generating plasma through utilization of microwave electron cyclotron resonance and directing the plasma along a divergent magnetic field to the substrate which is in an electrically floating state. Accroding to this deposition method, electrons in the plasma are continuously accelerated while continuing circular motion in the magnetic field, and hence they become high energy electrons, and the high energy electrons move along the divergent magnetic field owing to the interaction between the magnetic moment of their own and the divergent magnetic field to reach the substrate, chargning it negative. As a result of this, an electric field, which accelerates ions and decelerates electrons, is generated in the plasma stream from the plasma generating portion to the substrate. This electric field is so distributed as to satisfy the neutralizing condition under which the electrons and the ions coincide in flow rate with each other.

The ions for the film deposition by the ECR plasma deposition process are obtained by directly generating plasma of the film material through the use of microwave cycrotron resonance, or by ionizing the film material by high energy electrons which are produced by generating plasma of an excitation gas (for instance, argon) through the use of the microwave cyclotron resonance. In either case, the ions thus generated are accelerated by the electric field in the plasma stream towards the substrate to bombard it substantially perpendicularly thereto. Consequently, the film deposited on the substrate has directionality. That is to say, the film is close-packed or high-density in the direction of incidence of the ions, and it is hardly formed on the side wall of a stepped portion. Even if the film is deposited on the side wall, it is extremely low in density as compared with the film deposited on the flat surface portion, and consequently it is scarcely resistant to etching.

Moreover, according to the ECR plasma deposition method, since the film deposition reaction is promoted by bombarding the substrate with the plamsa stream. using the divergent magnetic field, the film deposition as at room temperature is possilbe without involving the application of thermal energy.

For silicon nitride film deposition, nitrogen ($N_2$), and silane ($SiH_4$) gases are introduced into the plasma, and specimen chamber, respectively. The etching rate of the nitride film, achieved by using a buffered hydrofluoric acid solution for film quality evaluation, is lower than 10 Å/min, which is a match for high temperature CVD film. The deposition rate is about 300 Å/min, which is comparable or superior to for the conventional plasma CVD method. By introducing an inert gas, such as argon (Ar), instead of nitrogen ($N_2$), a silicon film can be deposited.

Silicon film deposition can be applied to the fabrication of as solar cells, amorphous semiconductors, and other such devices. Silicon dioxide film can also be deposited by introducing oxygen ($O_2$) and silane ($SiH_4$) This silicon dioxide film is of high density, and a match for film prepared by the thermal oxidation method. During such deposition of the silicon oxide films 42 and 2' the photoresist layer 41a is neither deformed nor degenerated, so that excellent film can be deposited in the groove 42a. Furthermore, as the silicon oxide films 42 and 2' are not formed on the side wall of the photoresist layer 41a, the next lift-off step can easily be carried out.

Incidentally, the deposition of the silicon oxide film described above can be effected, for example, under such conditions as follows: $O_2$ (100%) and $SiH_4$ (100%) are each supplied at a flow rate of 10 cc/min and rendered into plasma by a microwave power of 100 W under a pressure of $2\times10^{-4}$ Torr to form the silicon oxide films. According to our experiments, the film deposition rate was about 260 Å/min, and the temperature of the substrate was approximately in the range of 60° to 80° C. The film deposition rate can be raised to 1000 Å/min by supplying the $O_2$ and $SiH_4$ at a flow rate of 30 cc/min and rendering them into plasma through using a microwave power of 200 W under the pressure of $4\times10^{-4}$.

After the deposition of the silicon oxide film 42 and 2', the photoresist layer 41a is removed with a stripping solution (for instance, a mixture of sulfuric acid and hydrogen peroxide, J-100, acetone or the like) and, at the same time, the silicon oxide film 2' on the photoresist layer 41a as depicted FIG. 4(D). Even if a silicon oxide film is a little deposited on the side wall of the photoresist layer 41a, since this silicon oxide film is not of high density, the phototesist stripping solution easily penetrates into the silicon oxide to remove the photoresist layer 41a. As this silicon oxide film can readily be removed with dilute fluoric acid, it is also possible to immerse the substrate assembly in the dilute fluoric acid for removing the silicon oxide film on the side wall of the photoresist layer 41a before, the lift-off step.

Then, the thin gate oxide film 43 about 30 to 50 μm thick is formed by a conventional thermal oxidation method, obtaining a structure having a flat surface as shown in FIG. 4(E).

Following this, the n type diffusion layer 45 about 3.5 μm depth is formed by the ion implantation in a desired region of the p type silicon substrate 41, after which the polycrystalline silicon is deposited on the entire area of the wafer surface as indicated by 44 in FIG. 4(F). It must be noted here that since the surfaces of the silicon oxide film 42 and the gate oxide film 43 upon which the polycrystalline silicon layer 44 is formed are planarized, the coverage of the polycrystalline silicon layer 44 is excellent, and that the surface of the polycrystalline silicon layer 44 is also planarized. The polycrystalline silicon layer 44 may be formed by the ECR plasma deposition method or some other method, for instance, the CVD method, evaporation method, and so on.

Next, the photoresist layer 41b of a predetermined pattern is formed as shown in FIG. 4(G). Also in this case, since the surface of the polycrystalline silicon layer 44 is flat, the coverage of the overlying photoresist layer 41b is excellent, and miniaturized patterning of the photoresist layer 41b by photolithography can be effected with ease.

Next, the polycrystalline silicon layer 44 is selectively etched away, using the photoresist layer 41b as a mask, by the dry etching technique capable of anithotropic etching, thus, forming the rectangular-sectioned groove 42b about 0.35 μm deep. Following this, ions of arsenic are implanted into the substrate 41, using the photoresist layer 41b and the polycrystalline silicon layer 44 as a mask, under the conditions of a 110 keV implanting energy and a $5\times10^{-15}$ cm$^{-2}$ dose, thereby forming the n+ type diffusion layer 47 as shown in FIG. 4(H).

Next, the silicon oxide film 49 is deposited by the aforementioned ECR plasma deposition method to the same thickness as the polycrystalline silicon layer 44, 0.35 μm in this embodiment, filling up the groove 42b as illustrated in FIG. 4(I). It must be noted here that since the silicon oxide films 49 and 9' can be deposited at low temperatures (approximately below 100° C. as described previously), the photoresist layer 41b is neither deformed nor degenerated, and that the deposition of the silicon oxide film has directionality and does not cause the formation of a silicon oxide film on the side wall of the photoresist layer 41b, and hence is suitable for the subsequent lift-off process. The conditions for the deposition of the silicon oxide films in this step may be the same as those mentioned previously.

Thereafter, the photoresist layer 41b is removed and the silicon oxide film 9' is lifted off to obtain a structure having a flat surface as shown in FIG. 4(J). In this step, the difference in surface level between the polycrystalline silicon layer 44 and the adjoining silicon oxide film 49 is so small as to be almost hegligible (about 0.10 μm or less); thus, sufficient planarization is effected. Accordingly, coverage of the photoresist layer 41c to be formed on the flat surface and the subsequent patterning by photolithography can be made excellent, permitting sufficient miniaturization of the photoresist layer 41c.

Next, the photoresist layer 41c is formed in a desired pattern as shown in FIG. 4(K).

This is followed by selective removal of the polycrystalline silicon layer 44, using the photoresist layer 41c as a mask, through the dry etching technique featuring anithotropic etching, by the which is formed a rectangular-sectioned groove 42c about 0.35 μm deep. Then, ions of boron are implanted into the substrate 41 through the photoresist layer 41c serving as a mask under the conditions of a 20 KeV implanting energy and a 1×10^15 cm² dose, forming the p+ type diffusion layer 46 as depicted in FIG. 4(L).

Next, the silicon oxide film 491 is deposited by the ECR plasma deposition method to the same thickness as the polycrystalline silicon layer 44, approximately 0.35 μm in this embodiment, filling up the groove 42c as illustrated in FIG. 4(M). At the same time as the silicon oxide film 491 is deposited, the silicon oxide film 91' is also formed on the photoresist layer 41c.

Next, the photoresist layer 41c is removed and the silicon oxide film 91' is lifted off, providing a structure of a flat surface as shown in FIG. 4(N). It must be noted here that since the surface to be deposited upon is planarized coverage of the photoresist layer 41d to be formed thereon and the subsequent patterning of the layer 41d by photolithography can be effected satisfactorily.

Next, the photoresist layer 41d is formed in a desired miniature pattern to obtain such a substrate assembly as shown in FIG. 4(O).

Next, the silicon oxide film 49 is selectively etched away by the aforementioned dry etching technique through the phororesist layer 41d used as a mask to form groove 42d about 0.4 μm deep as shown in FIG. 4(P). This etching is carried out until the surfaces of the p+ type diffused layer 46 and the n+ type diffused layer 47 are exposed to the outside.

Next, a silicon layer 48 as of amorphous silicon or polycrystalline silicon is deposited by the ECR plasma deposition technique until its surface becomes flush with the surfaces of the polycrystalline silicon layer 44 and the silicon oxide film 49, filling up the groove 42d as shown in FIG. 4(Q). In this case, the polycrystalline layer 8' is also deposited on the photoresist layer 41d.

Next, the photoresist layer 41d is removed and the polycrystalline layer 8' is lifted off as depicted in FIG. 4(R). The deposition of the silicon layer 44 is effected by supplying argon (Ar 100%) and silane (SiH₄ 100%) both at a flow rate of 10 cc/min and generating plasma of the mixture gas through using a 100 W microwave power under a pressure of 2×10⁻⁴ Torr. According to our experiment, the film deposition rate was around 200 Å/min. The film deposition rate can be raised by increasing the flow rate of the silane (SiH₄) and the microwave power.

Next, the substrate assembly is heat treated at about 1000° C. for 10 minutes, which is followed by the formation of the aluminum layer 410 through the ECR plasma deposition technique or the evaporation technique, and the formation of the photoresist layer 41e on the aluminum layer 410 at selected areas as shown in FIG. 4(S). It must be noted here that the planarized wafer surface in FIG. 4(R) permits excellent coverage of the overlying aluminum layer 410 and enables planarization of its surface, which leads to excellent coverage of the photoresist layer 41e which is formed on the aluminum layer 410. As a result of this, the photoresist layer 41e can be formed in a microminiature pattern, achieving high-density wiring.

Next, the aluminum layer 410 is selectively etched away by the aforementioned dry etching technique through using the photoresist layer 41e as a mask, whereby to form about 0.6 μm deep groove 42e as shown in FIG. 4(T).

Next, the silicon oxide film 411 is deposited by the ECR plasma deposition process, under the same conditions as the aforementioned ones, to the same thickness as the aluminum layer 410 (0.6 μm in this embodiment) to fill up the groove 42e as illustrated in FIG. 4(U). In this case, the silicon oxide film 11' is also deposited on the photoresist layer 41e.

Next, the photoresist layer 41e is removed and the silicon oxide film 11' is lifted off, providing such a wafer as shown in FIG. 4(V) which has a flat surface.

Next, the silicon oxide film 413 is formed by the ECR plasma deposition method at a low temperature (below 100° C.), after which the photoresist layer is deposited on the silicon oxide film 413 as indicated by 41f in FIG. 4(W). It must be noted here that a miniaturized resist pattern can be formed by the photoresist layer 41f.

Next, the silicon oxide film 413 is selectively etched away through the photoresist 41f serving as a mask by the dry etching method having etching anisotropy, forming about 0.8 μm deep groove 42f rectangular in cross section as depicted in FIG. 4(X).

Next, the aluminum layers 412 and 12' are deposited by the ECR plasma deposition technique as shown in FIG. 4(Y).

Next, the photoresist layer 41f is removed to obtain a wafer which has a flat surface as shown in FIG. 4(Z).

Finally, the aluminum layer 14 and the silicon oxide film 15 are formed on the aluminum layer 412 and the silicon oxide film 413, providing the wafer structure illustrated in FIG. 1.

The manufacturing process described above in respect of FIGS. 4(A) through 4(Z) is characterized by the repetition of the steps of forming a photoresist pattern, providing grooves in an underlying layer by etching through using the photoresist pattern as a mask, depositing a desired material in each groove by the ECR plasma deposition technique to the same thickness as the depth of the groove, and removing the photoresist pattern by the lift-off process. Since the photoresist layer is removed after depositing the desired material by the ECR plasma deposition process in the groove to the same thickness as its depth, the upper surface of each layer can be planarized. Therefore, the possibilities of breakage and shorting of such conductor layers as the polycrystalline silicon layers 44 and 48 and the aluminum layers 410, 412 and 14 can markedly be diminished as compared with such possibilities in the prior art. Moreover, as the upper surface of the photoresist layer can also be planarized, its selective removal by photolithography is easy, which permits the formation of a miniaturized photoresist pattern. In addition, a multi-level wiring structure can be easily obtained because the upper surface of each layer is flat.

The ECR plasma deposition process has such a feature that a silicon oxide film or silicon nitride film formed by this process has very few pinholes and is excellent in stoichimetry, in addition to the aforementioned feature that a conductor or insulator can be deposited with directionality at low temperatures. The etching rate of the silicon oxide formed by the abovesaid process is substantially equal to the etching rate of a silicon oxide film formend by the convention thermal oxidation technique. Furthermore, the silicon nitride film by the ECR plasma deposition method has a small hydrogen content and its etching rate does not particularly differ from that of a silicon nitride film obtained by the ordinary CVD method. Besides, the film deposited by this process is small in internal stress, and hence is advantageous in that no warping of the substrate is introduced.

The following Table 1 tabulates each layer etched by the dry etching technique and each layer formed by the subsequent ECR plasma deposition process in the manufacturing steps of FIG. 4(A) to (Z).

TABLE 1

| Number of photo-lithography | Layers removed by dry etching process | Drawings | Layers formed in grooves | Drawings |
|---|---|---|---|---|
| 1 | silicon substrate | FIG. 4(B) | silicon oxide layer | FIG. 4(C) |
| 2 | polycrystalline silicon layer | FIG. 4(H) | silicon oxide layer | FIG. 4(I) |
| 3 | polycrystalline silicon layer | FIG. 4(L) | silicon oxide layer | FIG. 4(M) |
| 4 | silicon oxide layer | FIG. 4(P) | polycrystalline silicon layer | FIG. 4(Q) |
| 5 | aluminum layer | FIG. 4(T) | silicon oxide layer | FIG. 4(U) |
| 6 | silicon oxide layer | FIG. 4(X) | aluminum layer | FIG. 4(Y) |

In the above table, comparison of the columns Nos. 3 and 4 or 5 and 6 indicates that the materials of the layer to be etched and the materials to be formed next are opposite in order. Namely, the materials to be etched and the material to be deposited in the grooves can be selected at will. In other ords, the aluminum wiring layer can be formed by a method of depositing aluminum over the entire area of the surface of an underlying layer and then recessing thereinto the silicon oxide film at that area which is not used as an interconnection line, or by a method of recessing the aluminum layer in the area which is used as the interconnection line. The same structure is obtainable by the both methods and a convenient one of them can be selected.

While in the embodiments of FIGS. 1 to 3 a p type silicon substrate is used as the semiconductor substrate, it is a matter of course that an n type silicon substrate and other semiconductor substrates, for instance, a GaAs substrate can also be employed. Namely, the present invention is not limited specifically to the silicon substrate by may also be applicable to compound semiconductors. In this case, it is needless to say that the conductivity types of diffusion layers formed in the substrate or impurities for the formation of the diffused layers must be selected properly. Moreover, polycrystalline silicon is employed for forming the electrode for contact with the gate electrode and the diffused layer, but such electrodes can also be replaced with conductor layers of silicon-doped aluminum, molybdenum silicide, molybdenum, tungsten and so forth. Further, although interconnection line layers are described to be formed of aluminum, they may also similarly be replaced with conductor layers of silicon-doped aluminum, molybdenum silicide, molybdenum, tungsten and so forth.

In the embodiments described in the foregoing, the silicon oxide film for field isolation or insulation use may also be replaced with a silicon nitride film formed by the ECR plasma deposition process. This can be achieved, for example, by supplying $N_2$ (100%) at a flow rate of 15 cc/min and $SiH_4$ (100%) at a rate of 10 cc/min and using a microwave power of 100 W.

In the embodiment of FIGS. 4(A) through (Z), the thermal oxidation method, which is utilized for forming the gate oxide film 43 shown in FIG. 4(E), is described to be used for high temperature heat treatment, but it is a matter of course that suitable heat treatment must also be carried out after ion implantation for forming diffusion layers. Needless to say, heat treatment steps, can suitable be added as required.

FIG. 4(E) shows the wafer structure in which the surface of the oxide film 43 becomes flat after the formation of the gate oxide film. To this end, the silicon oxide film recessed into the p type silicon substrate 41 is formed so that its surface slightly projects out from the substrate surface as shown in FIG. 4(D). The gate oxide film 43 is as thin as hundreds of A and when the silicon is transferred into the silicon oxide film, the thickness in which the silicon is actually consumed is one-half the thickness of the resulting silicon oxide film. The step height resulting from the gate oxidation is almost equal to the thickness of silicon that is consumed; namely, this step height is so small that it hardly matters in practice. Therefore, the formation of such a small height is not always important in practice.

In FIG. 4(E) the gate oxide film 43 is described to be formed by the thermal oxidation method but it may also be formed, for instance, by anodic process or the like. Of course, the gate oxide film may be replaced with a silicon nitride film that is formed by a thermal nitriding method. In FIG. 4(Y) the aluminum layer 412 is formed by the ECR plasma deposition method but it may also be formed by some other plasma deposition process which is capable of forming a film of excellent directionality.

Although the foregoing embodimetns have been described in connection with the case where photolithography is utilized, the present invention can equally be achieved by electron beam lithography which uses electron beam resist in place of the photoresist, or other lithographic techniques.

As has been described in the foregoing, according to the present invention, the upper surfaces of the conductor layers which serve as electrodes (for example, the polycrystalline silicon layers 4 and 8 in FIG. 1 and 329 in FIG. 3) and the insulating layers (for instance, the silicon oxide films 9 in FIG. 1 and 330 in FIG. 3) are planarized, and the upper surfaces of the conductor layer which serve as interconnection lines (for example, the aluminum layers 10 in FIG. 10 and 331 in FIG. 3) and the insulating layer (for instance, the silicon oxide films 11 in FIG. 1 and 330 in FIG. 3) are planarized; this diminishes the possibilities of breakage and shorting of interconnection lines which are liable to occur at stepped portions in the prior art devices. Hence, the present invention possesses the advantages of high reliability and high yield rate of fabrication. Moreover, since the upper surface of each layer is planarized, not only lateral but also vertical dimensions of patterns can be freely set and, consequently, the lateral dimensions can sufficiently be reduced. And, by increasing the vertical dimensions of the patterns, it is possible to reduce the resistance of the conductor layer and parasitic capacitance. Accordingly, high operating speed and high packing density of the semiconductor integrated circuit can be achieved.

Furthermore, according to the present invention, a conductor layer intended for use as an electrode and an adjoining insulating layer, or a conductor layer intended for use as an interconnection line and an adjoining layer, are formed by a process including steps of forming a layer of a first material on a semiconductor substrate, forming a photoresist pattern on the first material layer, selectively etching away the first material layer through the photoresist pattern serving as a mask, depositing a second material to a predetermined thickness on the substrate assembly by virtue of a low themperature chemical reaction through utilization of the ECR plasma deposition technique or the like, and removing the photoresist pattern to remove the second material deposited thereon. Therefore, the present invention has the advantage that the upper surface of each layer can be planarized.

While in the foregoing the present invention has been described as being applied to a semiconductor integrated circuit, the structure and manufacturing method of the invention can also be applied to other high-density integrated circuit devices or electronic parts, such as a Josephson integrated circuit, a printed wiring board and so forth.

It will be apparent that many modifications and variations may be effected without departing from the scope of the novel concepts of the present invention.

What is claimed is:

1. A method for the manufacture of a semiconductor integrated circuit, comprising the step of:
   forming a resist pattern on a first material layer of a semiconductor substrate;
   removing a portion of said first material layer through using said resist pattern as a mask to form a recess in said first material layer;
   forming a second material layer by a plasma deposition process to thickness substantially equal to the depth of said recess so as to fill said recess; and
   removing said second material layer on said resist pattern by a lift-off process, along with said resist pattern;
   wherein said steps are each carried out repeatedly at least four times.

2. A method for the manufacture on a semiconductor integrated circuit, comprising the steps of:
   forming a first resist pattern on a semiconductor substrate;
   removing a portion of said semiconductor substrate through using said first resist pattern as a mask to form a groove in said semiconductor substrate;
   filling up said groove with an insulating material by a plasma deposition process;
   removing said insulating material on said first resist pattern by a lift-off process, together with said first resist pattern; forming an insulating film on said semiconductor substrate;
   forming on said insulating film a first conductor layer which will ultimately serve as a gate electrode;
   forming a second resist pattern on said first conductor layer;
   removing a portion of said first conductor layer through using said second resist pattern as a mask to form a recess in said first conductor layer;
   forming a source region and a drain region in said semiconductor substrate through using said first conductor layer as a mask;
   filling up said recess of said first conductor layer with a first insulating layer by the plasma deposition process;
   removing said insulating layer on said second resist pattern by the lift-off process, together with said second resist pattern;
   forming a third resist pattern on said first conductor layer and said insulating layer;
   removing said insulating film and said first insulating layer on said source and drain regions through using said third resist pattern as a mask to form recesses in said insulating film and said first insulating layer;
   filling said recesses of said insulating film and said first insulating layer, by the plasma deposition process, with another first conductor layer which is different from said first conductor layer and will form a source electrode and a drain electrode;
   removing said another first conductor layer on said third resist pattern by the lift-off process, together with said third resist pattern;
   forming a second conductor layer on said another first conductor layer and said first insulating layer;
   forming a fourth resist pattern on said second conductor layer;
   removing a portion of said second conductor layer through using said fourth resist pattern as a mask to form a recess in said second conductor layer;
   filling up said recess of said second conductor layer with a second insulating layer by the plasma deposition process; and
   removing said second insulating layer on said fourth resist pattern by the lift-off process, together with said fourth resist pattern.

3. A method for the manufacture of a semiconductor integrated circuit according to claim 2 wherein said plasma deposition process is an ECR plasma deposition process.

* * * * *